(12) United States Patent
Iwahashi

(10) Patent No.: US 6,452,853 B2
(45) Date of Patent: Sep. 17, 2002

(54) NONVOLATILE SEMICONDUCTOR MEMORY

(75) Inventor: Hiroshi Iwahashi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/901,055

(22) Filed: Jul. 10, 2001

Related U.S. Application Data

(62) Division of application No. 09/605,423, filed on Jun. 28, 2000, now Pat. No. 6,292,423.

(30) Foreign Application Priority Data

Jun. 28, 1999 (JP) ............................................. 11-181877

(51) Int. Cl.⁷ ................................................. G11C 7/00
(52) U.S. Cl. .................................. 365/226; 365/185.17
(58) Field of Search ............................ 365/226, 185.17, 365/185.25, 185.26, 230.06

(56) References Cited

U.S. PATENT DOCUMENTS

| | | |
|---|---|---|
| 5,295,106 A | 3/1994 | Jinbo |
| 5,400,279 A | 3/1995 | Momodomi et al. ......... 365/185 |
| 5,473,563 A | 12/1995 | Suh et al. ............... 365/185.13 |
| 5,477,500 A | 12/1995 | Iwahashi ............... 365/230.06 |
| 5,673,223 A | 9/1997 | Park ....................... 365/185.17 |
| 5,848,009 A | 12/1998 | Lee et al. ................... 365/200 |
| 5,898,616 A * | 4/1999 | Ono ....................... 365/185.17 |
| 6,072,719 A | 6/2000 | Tanzawa et al. ........ 365/185.03 |

FOREIGN PATENT DOCUMENTS

| | | |
|---|---|---|
| JP | 6-162787 | 6/1994 |
| JP | 7-130888 | 5/1995 |

* cited by examiner

*Primary Examiner*—Richard Elms
*Assistant Examiner*—Anh Phung
(74) *Attorney, Agent, or Firm*—Banner & Witcoff, Ltd.

(57) ABSTRACT

A nonvolatile semiconductor memory includes a memory cell string containing a selection transistor and at least one cell transistor which is connected to the selection transistor and has a floating gate. Cell transistors are arranged in a memory cell array. The transistors each have a charge accumulation layer. A potential supply circuit supplies a potential different from a ground potential to gates of the cell transistor at least read operation and when the memory cell array is unselected.

14 Claims, 12 Drawing Sheets

NONVOLATILE SEMICONDUCTOR MEMORY

This application is a Divisional of U.S. application Ser. No. 09/605,423 filed on Jun. 28, 2000, now U.S. Pat. No. 6,292,423 issued on Sep. 18, 2001.

CROSS-REFERENCE TO RELATED APPLICATIONS

This application is based upon and claims the benefit of priority from the prior Japanese Patent Application No. 11-181877, filed Jun. 28, 1999, the entire contents of which are incorporated herein by reference.

BACKGROUND OF THE INVENTION

The present invention relates to a nonvolatile semiconductor memory capable of storing data of a plurality of bits in one cell transistor and, more particularly, to an improvement in the data holding characteristics of the cell transistor.

As a general nonvolatile semiconductor memory, an electrically erasable programmable EEPROM, particularly, a flash memory is well known. The flash memories can be categorized into a NAND type and a NOR type memories. The conventional problems will be explained by exemplifying a NAND flash memory.

FIG. 1 is an equivalent circuit diagram showing memory cells of a NAND flash memory.

As shown in FIG. 1, the memory cell contains a selection transistor, a plurality of cell transistors (cell transistors 1 to 4), and a switching transistor that are connected to each other between a bit and a source lines. Each cell transistor has a floating gate. In this specification, the memory cell shown in FIG. 1 will be called a memory cell string for convenience. Memory cell strings are arranged in a matrix on a memory cell array, as shown in FIG. 2.

In the NAND flash memory in which one cell transistor stores 1-bit data, logic values "1" and "0" of data stored in the cell transistor correspond to "positive" and "negative" of the threshold voltage of the cell transistor, respectively. Whether the threshold voltage of the cell transistor is "positive" or "negative" is determined in accordance with an electron charge state in the floating gate. When electrons are injected in the floating gate, the threshold voltage is "positive"; and when electrons are discharged from the floating gate, the threshold voltage is "negative". Electrons are injected/discharged to/from the floating gate via the first gate insulating film between the floating gate and the channel region using the tunnel effect.

In writing data in the cell transistor, the switching transistor is turned "off".

In reading out data from the cell transistor, the switching transistor is turned "on". At the same time, the selection transistor connected to a cell transistor (to be referred to as a selected cell transistor) from which data is to be read out is turned "on". The control gate of the selected cell transistor is set to logic "0" (e.g., ground potential), whereas the control gate of each unselected cell transistor is set to logic "1". If the threshold voltage of the selected cell transistor is "negative", and its control gate is at logic "0", the cell transistor is turned "on"; and if the threshold of the selected cell transistor is "positive", and its control gate is at logic "0", the cell transistor is turned "off". In this manner, the data logic is discriminated between "1" and "0" depending on whether the selected cell transistor is "ON" or "OFF". Since the control gate of each unselected cell transistor is set to logic "1", the unselected cell transistor is turned "on" regardless of whether the threshold voltage is "positive" or "negative".

In the NAND flash memory, each unselected cell transistor among series connected cell transistors is turned "on". Data stored in a selected cell transistor is read out depending on whether the selected cell transistor is turned "on" or "off", i.e., a current flows or does not flow through the memory cell string.

When the selection transistor is "not selected", the control gate of a cell transistor connected to the unselected selection transistor is set to logic "0" to stand by.

To store data of a plurality of bits in one cell transistor in the NAND flash EEPROM, a plurality of threshold voltages are set for the cell transistor. For example, to store 2-bit data in one cell transistor, four threshold voltages are set, as shown in Table 1.

TABLE 1

| Threshold Voltage | Storage Data | |
|---|---|---|
| | D1 | D2 |
| Vth1 | 0 | 0 |
| Vth2 | 0 | 1 |
| Vth3 | 1 | 0 |
| Vth4 | 1 | 1 |

Vth1<Vth2<Vth3<Vth4

Letting (D1, D2) be 2-bit memory data, as shown in Table 1, the threshold voltages of the cell transistor correspond to combinations of data (D1, D2), respectively. For example, threshold voltages Vth1, Vth2, Vth3, and Vth4 correspond to combinations (0,0), (0,1), (1,0), and (1,1) of data (D1, D2), respectively. Assuming that the threshold voltages Vth1 to Vth4 have a relation "Vth1<Vth2<Vth3<Vth4", as shown in Table 1, the threshold voltage Vth1 is set to a negative value, and the threshold voltages Vth2, Vth3, and Vth4 are set to positive values.

Data read from this cell transistor will be explained with reference to FIG. 3.

When cell transistor 2 shown in FIG. 1 is selected, a selected word line WL2 is set to a potential between the threshold voltages Vth1 and Vth2. If the threshold voltages Vth1 and Vth2 have negative and positive values, respectively, the selected word line WL2 is set to 0 V. This potential is "selected word line potential 1". At this time, the potentials of unselected word lines WL1, WL3, and WL4 are set higher than the threshold voltage Vth4 so as to turn on at least one of cell transistors 1, 3, and 4 even at the highest threshold voltage Vth4 (unselected word line potential is not shown).

If the threshold voltage of cell transistor 2 is "Vth1", cell transistor 2 is turned on. As a result, a bit line connected to cell transistor 2 is discharged via the selection transistor, cell transistors 1 to 4, and switching transistor. This state is detected by a sense amplifier. At this time, D1="0" and D2="0" are determined.

If the threshold voltage of cell transistor 2 is "Vth2" or higher, cell transistor 2 is kept off, and the bit line is kept charged.

Then, the selected word line WL2 is set to a potential between the threshold voltages Vth2 and Vth3. This potential is "selected word line potential 2". If the threshold voltage of cell transistor 2 is "Vth2", cell transistor 2 is turned on. The bit line connected to cell transistor 2 is discharged via the selection transistor, cell transistors 1 to 4, and switching transistor. This state is detected by the sense amplifier. At this time, D1="0" and D2="1" are determined.

If the threshold voltage of cell transistor 2 is "Vth3" or higher, cell transistor 2 is kept off, and the bit line is kept charged.

Then, the selected word line WL2 is set to a potential between the threshold voltages Vth3 and Vth4. This potential is "selected word line potential 3". If the threshold voltage of cell transistor 2 is "Vth3", cell transistor 2 is turned on. The bit line connected to cell transistor 2 is discharged via the selection transistor, cell transistors 1 to 4, and switching transistor. This state is detected by the sense amplifier. At this time, D1="1" and D2="0" are determined.

If the threshold voltage of cell transistor 2 is "Vth4" or higher, cell transistor 2 is kept off, and the bit line is kept charged. This state is detected by the sense amplifier. At this time, D1="1" and D2="1" are determined. Alternatively, the potential of the selected word line WL2 may be set to the thresh-old voltage Vth4 or higher, and the discharge state of the bit line may be detected by the sense amplifier.

Upon completion of data read, the potentials of the word lines WL1 to WL4 are set to 0 V. The potentials of the word lines of cell transistors which are connected to a selection transistor which is unselected, i.e., receives a signal SG of "0" are also set to 0 V.

A memory (to be referred to as a multilevel memory for convenience) in which one cell transistor stores data of a plurality of bits requires a larger number of threshold voltages than a memory (to be referred to as a binary memory for convenience) in which one cell transistor stores 1-bit data. For this reason, the highest threshold voltage in the multilevel memory becomes higher than the highest threshold voltage in the binary memory. In other words, a larger amount of electrons are injected to the floating gate in the multilevel memory than in the binary memory.

Since a larger amount of electrons are injected to the floating gate in the multilevel memory than in the binary memory, this strengthens the electric field between the floating gate and the channel, the electric field between the floating gate and the drain, and the electric field between the floating gate and the source. Consequently, the possibility of discharging electrons from the floating gate is increased. This is unpreferable in terms of memory reliability, particularly, data holding reliability.

Electrons are injected to the floating gate via the gate insulating film between the floating gate and the channel by using the tunnel effect. To realize this, a very thin gate insulating film is formed, and the reliability of this thin gate insulating film is very important. However, the potential of the word line of a cell transistor connected to a selection transistor which receives the signal SG of "0" is set to 0 V. Since a larger amount of electrons are injected into the floating gate in the multilevel memory than in the binary memory, the electric field applied to the thin gate insulating film strengthens. Hence, it is difficult to ensure the same reliabilty of the thin gate insulating film as that of the binary memory.

BRIEF SUMMARY OF THE INVENTION

A semiconductor memory device according to an aspect of the present invention comprises: a memory cell array in which cell transistors each having a charge accumulation layer are arranged in a matrix; and a potential supply circuit configured, a least in a read operation, to supply a potential different from a ground potential to gares of the cell transistors when the memory cell array is unselected.

To achieve the main object, in a nonvolatile semiconductor memory according to the present invention, when a selection transistor is unselected, a potential different from the ground potential is supplied to the gate of a cell transistor connected to the unselected selection transistor. This can relax the electric field generated around a charge accumulation layer, compared to the prior art in which the ground potential is supplied to the gate of the cell transistor connected to the unselected selection transistor. Since the electric field generated around the charge accumulation layer is relaxed, charges are prevented from being emitted by the charge accumulation layer. A decrease in data holding reliability is suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DETAILED DESCRIPTION OF THE INVENTION

Figure 1:
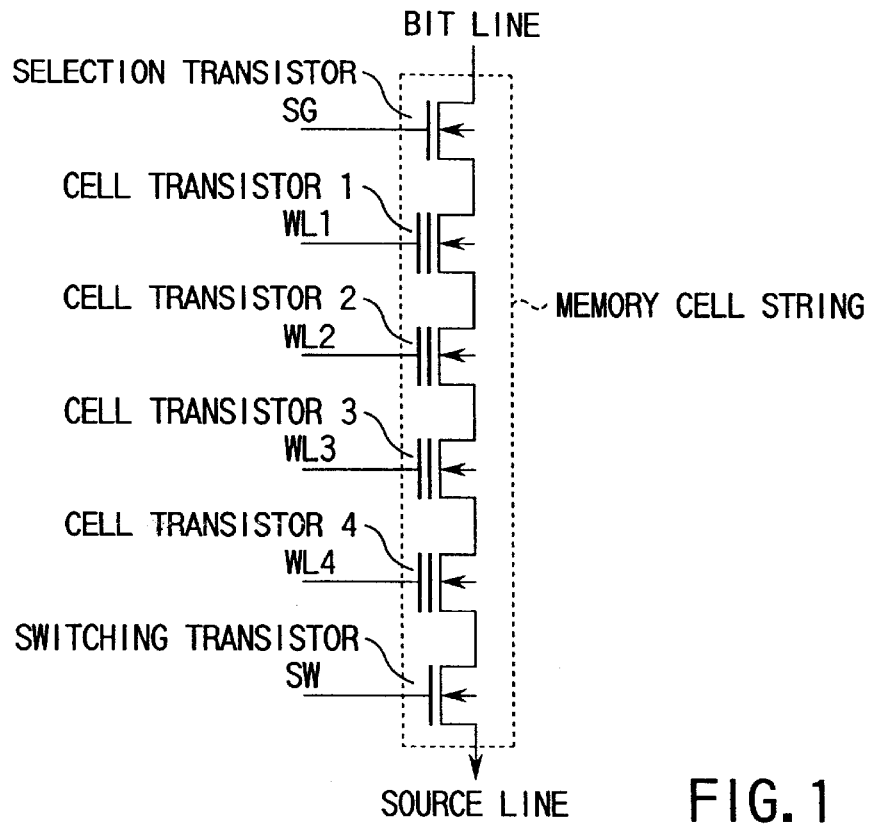
FIG. 1 is an equivalent circuit diagram showing the memory cell of a NAND flash EEPROM.

Embodiments of the present invention will be described below with reference to the several views of the accompanying drawing. In the following description, the same reference numerals denote the same parts throughout the drawing.

(First Embodiment)

The first embodiment of the present invention will be described with reference to FIG. 4.

Figure 4:
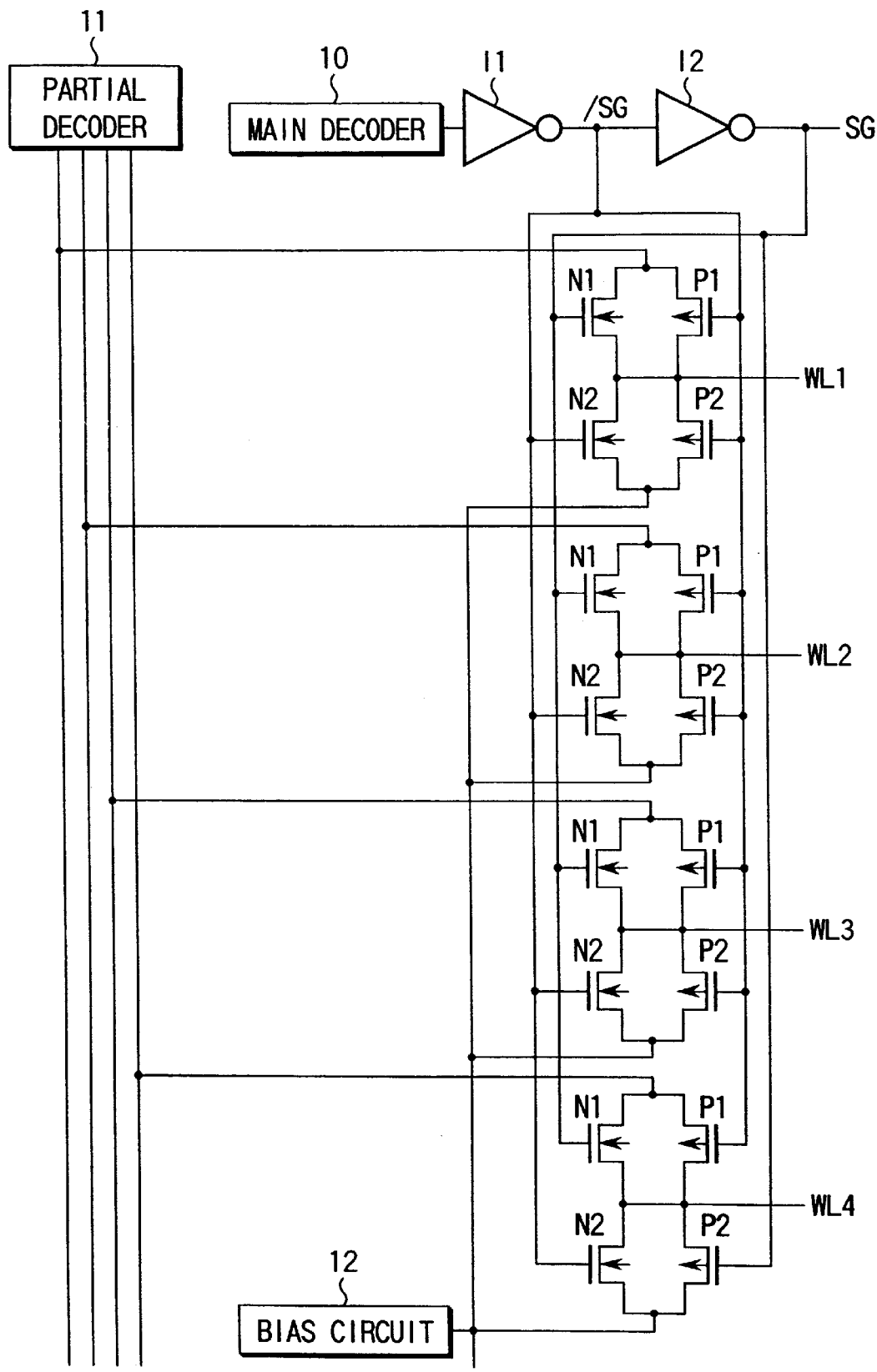
FIG. 4 is a circuit diagram showing part of the row decoder of a nonvolatile semiconductor memory according to the first embodiment of the present invention.

FIG. 4 is a circuit diagram showing part of the row decoder of a nonvolatile semiconductor memory according to the first embodiment of the present invention. The circuit shown in FIG. 4 is connected to, e.g., the memory cell string shown in FIG. 2. The first embodiment is preferably applied to, e.g., a NAND flash EEPROM.

As shown in FIG. 4, a main decoder 10 outputs a signal for selecting a selection transistor in response to an address signal (not shown). An output from the main decoder 10 is input to an inverter I1, an output signal /SG from the inverter I1 is input to an inverter I2, and an output signal SG from the inverter I2 is supplied to the gate of the selection transistor.

When the output from the main decoder 10 is "1", the signal SG is "1", and a selection transistor for one row is selected. The signal /SG is supplied to the gate of each P-channel transistor P1 and that of each N-channel transistor N2, whereas the signal SG is supplied to the gate of each P-channel transistor P2 and that of each N-channel transistor N1.

When the signals /SG and SG are "0" and "1", the transistors N1 and P1 are turned on, and the transistors N2 and P2 are turned off. Then, signals from the partial decoder 11 are supplied to corresponding word lines WL1 to WL4 via the transistors N1 and P1.

Figure 3:
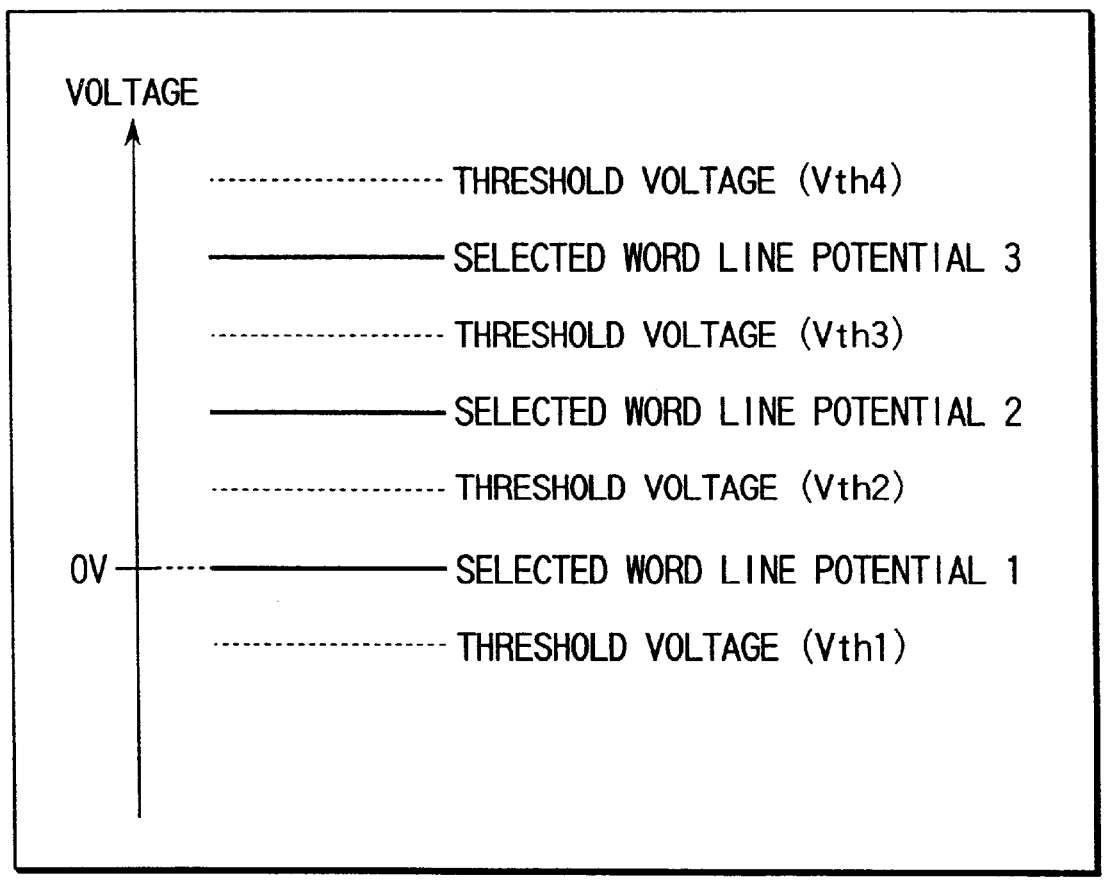
FIG. 3 is a view showing the relationship between the threshold voltage of a cell transistor and a selected word line potential.

The partial decoder 11 sets one of signals corresponding to the word lines WL1 to WL4 to "0" and the remaining signals to "1" in response to an address signal. That is, one selected word line is set to "0", and the remaining word lines are set to "1". Note that "0" of the selected word line corresponds to selected word line potentials 1 to 3 shown in FIG. 3.

When an output from the main decoder 10 is "0", i.e., the selection transistor is unselected, the signal /SG and SG change to "1" and "0", respectively. In this case, the transistors N1 and P1 are turned off, and the transistors N2 and P2 are turned on. Then, a predetermined voltage output from a bias circuit 12 is applied to the word lines WL1 to WL4 via the transistors N2 and P2. In the prior art, when the selection transistor is unselected, the ground potential (0 V) is applied to the word lines WL1 to WL4 instead of a predetermined voltage output from the bias circuit 12. In other words, when the selection transistor is unselected, 0 V is supplied to the control gates of cell transistors connected to the unselected selection transistor.

As long as the selection transistor remains off, a prescribed voltage is applied from the bias circuit 12 to the word lines WL1 to WL4. That is, this voltage is applied to the word lines WL1 to WL4 not only when data is read from or written into the semiconductor memory, but also while the semiconductor memory remains not selected or stays in waiting state.

Several circuit examples of the bias circuit 12 are shown in FIGS. 5A to 5D.

Figure 5A:
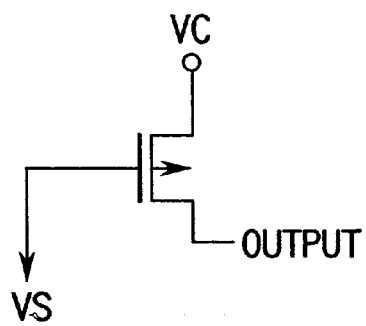
FIGS. 5A, 5B, 5C and 5D are circuit diagrams each showing a circuit example of a bias circuit.

FIG. 5A is a circuit diagram showing the first circuit example of the bias circuit 12.

The bias circuit 12 shown in FIG. 5A outputs an externally supplied power supply voltage VC (to be referred to as an external power supply voltage VC hereinafter) as an output voltage OUTPUT. Recently, the potential of the external power supply voltage VC is decreasing to, e.g., 3.3 V or 1.8 V. When the external power supply voltage VC is 3.3 V or 1.8 V, the voltage VC is boosted by the internal booster circuit of an integrated circuit, and a boosted voltage VH is used as an internal power supply voltage. The boosted voltage VH is applied to, e.g., a row decoder and to the control gate of a cell transistor. For this reason, the output voltage of the bias circuit 12 may be the external power supply voltage VC depending on the magnitude of the external power supply voltage VC.

Figure 5B:
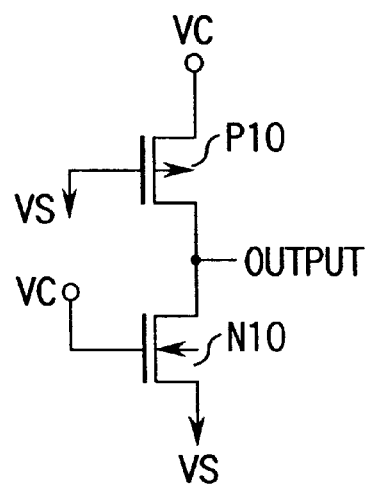

FIG. 5B is a circuit diagram showing the second circuit example of the bias circuit 12.

The bias circuit 12 shown in FIG. 5B obtains the output voltage OUTPUT from the node between P- and N-channel transistors P10 and N10. This bias circuit 12 can attain an arbitrary output voltage OUTPUT in accordance with the ratio between the resistance values of the transistors P10 and N10.

Figure 5C:
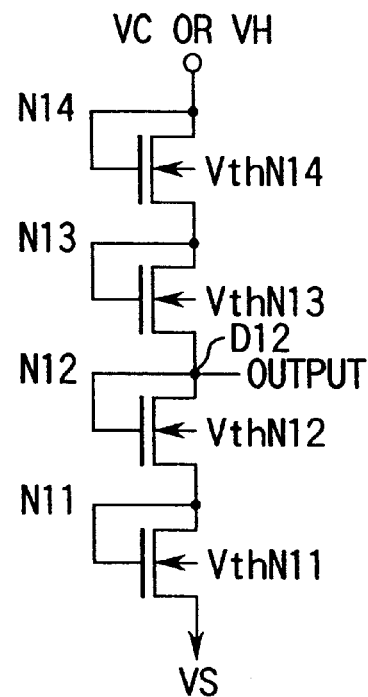

FIG. 5C is a circuit diagram showing the third circuit example of the bias circuit 12.

In the bias circuit 12 shown in FIG. 5C, N-channel transistors N11 to N14 whose gates and drains are connected are series-connected between a reference potential VS (e.g., ground potential=0 V) and the external power supply voltage VC, and the output voltage OUTPUT is obtained from an arbitrary one of the nodes between the transistors N11 to N14. In FIG. 5C, for example, the output voltage OUTPUT is obtained from the node between the transistors N12 and N13.

If the output voltage OUTPUT becomes lower than "VC−(VthN14+VthN13)" as the difference of the sum of the threshold voltages VthN14 and VthN13 of the transistors N14 and N13 from the external power supply voltage VC in obtaining the output voltage OUTPUT from the drain (D12) of the transistor N12, as shown in FIG. 5C, the output voltage OUTPUT is charged up to "VC−(VthN14+VthN13)".

If the output voltage OUTPUT rises above the sum of the threshold voltage VthN12 of the transistor N12 and the threshold voltage VthN22 of the transistor N22, the output voltage OUTPUT is discharged up to "VS+(VthN12+VthN11)" higher than the reference potential VS by the sum of VthN12 and VthN11. That is, the output voltage OUTPUT is set to a voltage between "VS+(VthN12+VthN11)" and "VC−(VthN14+VthN13)".

By setting the sum of the threshold voltages VthN11, VthN12, VthN13, and VthN14 to be higher than the external power supply voltage VC, no stationary current flows between the external power supply voltage VC and the reference potential VS, which saves current consumption.

Note that the bias circuit 12 shown in FIG. 5C need use not the external power supply voltage VC, but the voltage VH boosted by the internal booster circuit of the integrated circuit.

The number of transistors is not limited to four in FIG. 5C, and may be optimized in accordance with the threshold voltage of the transistor and the external power supply voltage VC (or boosted voltage VH).

Figure 5D:
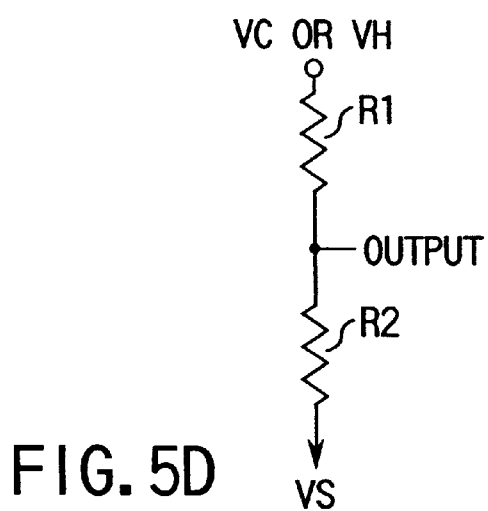

FIG. 5D is a circuit diagram showing the fourth circuit example of the bias circuit 12.

The bias circuit 13 shown in FIG. 5D obtains the output voltage OUTPUT from the node between resistors R1 and R2 series-connected between the reference potential VS (e.g., ground potential=0 V) and the external power supply voltage VC or boosted voltage VH. This bias circuit 12 can attain an arbitrary output voltage OUTPUT in accordance with the ratio between the resistance values of the resistors R1 and R2.

Figure 2:
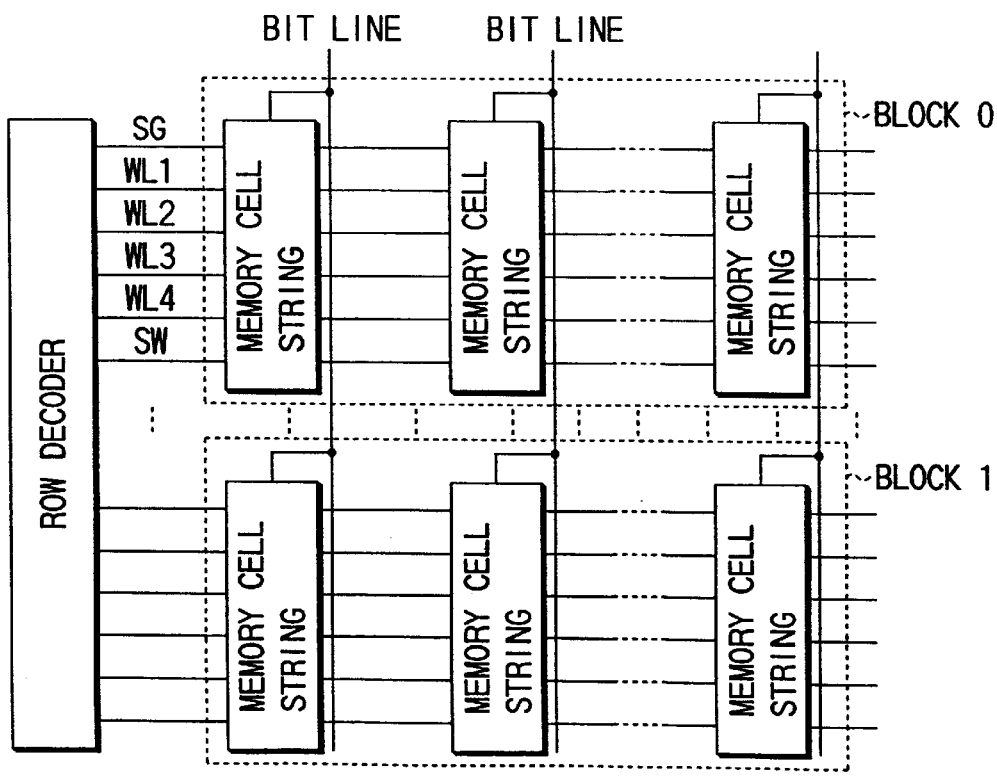
FIG. 2 is a block diagram showing the memory cell array of the NAND flash EEPROM.

A cell transistor having the lowest threshold voltage and a cell transistor having the highest threshold voltage will be considered. Assume that, e.g., block 0 shown in FIG. 2 is selected while block 1 is unselected.

An optimal voltage (to be described below) is applied to the control gate (word line) regardless of the threshold voltage of a cell transistor in block 1, i.e., data written in the cell transistor. This will be explained in more detail with reference to FIG. 3.

The threshold voltages of two arbitrary cell transistors in unselected block 1 are assumed to be Vth1=−2 V and Vth4=7 V, respectively. "V1" represents the floating gate potential of a cell transistor having the threshold voltage Vth1 when the control gate is at 0 V, and "V4" represents the floating gate potential of a cell transistor having the threshold voltage Vth4 when the control gate is at 0 V.

Letting "$V_{CG}$" be the control gate potential, the floating gate potential of the cell transistor having the threshold voltage Vth1 is given by "$V_{CG} \times \alpha + V1$", and that of the cell transistor having the threshold voltage Vth4 is given by "$V_{CG} \times \alpha + V4$". (Note that $\alpha$ is a figure between 0 and 1.) Since each cell transistor is controlled by the floating gate potential, floating gate potentials when transistors are turned on are the same even with different threshold voltages with respect to the control gate.

If a cell transistor is turned on when the floating gate is at 1 V, a cell transistor having the threshold voltage Vth1=−2 V satisfies −2×α+V1=1, and a cell transistor having the threshold voltage Vth4=7 V satisfies 7×α+V4=1. For α=0.6, V1=2.2 and V4=−3.2. Accordingly, the floating gate potential of the cell transistor having the threshold voltage Vth1=−2 V is $V_{CG} \times 0.6 + 2.2$, and that of the cell transistor having the threshold voltage Vth4=7 V is $V_{CG} \times 0.6 − 3.2$. Since $V_{CG} \times 0.6 + 2.2$ is a positive value, and $V_{CG} \times 0.6 − 3.2$ is a negative value, a potential at which the sum of these values is 0 is an optimal control gate potential.

Hence, the control gate potential $V_{CG}$ for $V_{CG} \times 0.6 + 2.2 + V_{CG} \times 0.6 − 3.2 = 0$ is (3.2−2.2)/(2×0.6). In other words, $V_{CG}$=0.83 V is preferably set as the output voltage OUTPUT of the bias circuit 12. This value changes in correspondence with the threshold voltage of a cell transistor to be set or the characteristics of the cell transistor. For example, "α" is a value determined by capacitive coupling between the control gate and the floating gate, capacitive coupling between the floating gate and the channel, and the like. For α=0.7, V1=2.4 and V4=−3.9. Hence $V_{CG} \times 0.7 + 2.4 + V_{CG} \times 0.7 − 3.9 = 0$ and $V_{CG}$=1.07 V.

When $V_{CG}$=0.83 V is set for α=0.6 in this manner, the floating gate potential of the cell transistor having Vth1=−2 V is about +2.7 V, and the floating gate potential of the cell transistor having Vth4=7 V is about −2.7 V. The electric field between the floating gate and channel of a cell transistor having the lowest threshold voltage can be made equal to that between the floating gate and channel of a cell transistor having the highest threshold voltage. That is, the electric field applied to the gate insulating film below the floating gate can be made equal between the cell transistor having the lowest threshold voltage and the cell transistor having the highest threshold voltage. Compared to the prior art, the reliability can be improved.

In the above description, the present invention is applied to a NAND flash EEPROM. Next, a NOR flash EEPROM will be considered.

In the NOR flash EEPROM, since the threshold voltage of a cell transistor does not take any negative value, the threshold voltage of a cell transistor having the lowest threshold voltage and that of a cell transistor having the highest threshold are assumed to be Vth1=1 V and Vth4=10 V, respectively. "V1" represents the floating gate potential of a cell transistor having the threshold voltage Vth1 when the control gate is at 0 V, and "V4" represents the floating gate potential of a cell transistor having the threshold voltage Vth4 when the control gate is at 0 V.

Letting "$V_{CG}$" be the control gate potential, the floating gate potential of the cell transistor having the threshold voltage Vth1 is given by "$V_{CG} \times \alpha + V1$", and that of the cell transistor having the threshold voltage Vth4 is given by "$V_{CG} \times \alpha + V4$". (Note that α is a figure between 0 and 1.) Since each cell transistor is controlled by the floating gate potential, floating gate potentials when transistors are turned on are the same even with different threshold voltages with respect to the control gate.

Similar to the NAND flash EEPROM, if a cell transistor is turned on when the floating gate potential is 1 V, a cell transistor having the threshold voltage Vth1=1 V satisfies 1×α+V1=1, and a cell transistor having the threshold voltage Vth4=10 V satisfies 10×α+V4=1. For α=0.6, V1=0.4 and V4=−5. The floating gate potential of the cell transistor having the threshold voltage Vth1=1 V is $V_{CG} \times 0.6 + 0.4$, and that of the cell transistor having the threshold voltage Vth4=10 V is $V_{CG} \times 0.6 − 5$. To make the electric field between the floating gate and the channel equal between the cell transistor having the threshold Vth1 and the cell transistor having the threshold Vth4, since $V_{CG} \times 0.6 + 0.4$ is a positive value and $V_{CG} \times 0.6 − 5$ is a negative value, again a potential at which the sum of these values is 0 is an optimal control gate potential. Consequently, the value $V_{CG}$ for $V_{CG} \times 0.6 + 0.4 + V_{CG} \times 0.6 − 5 = 0$ is (5−0.4)/(2×0.6). In other words, $V_{CG}$=3.83 V is preferably set as the output voltage OUTPUT of the bias circuit 12.

By setting the control gate potential in this way, the electric field between the floating gate and channel of a cell transistor having the lowest threshold voltage can be made equal to that between the floating gate and channel of a cell transistor having the highest threshold voltage. That is, the electric field applied to the gate insulating film below the floating gate can be made equal between the cell transistors having the lowest and highest threshold voltages. Compared to the prior art, the reliability can be improved.

Figure 6:
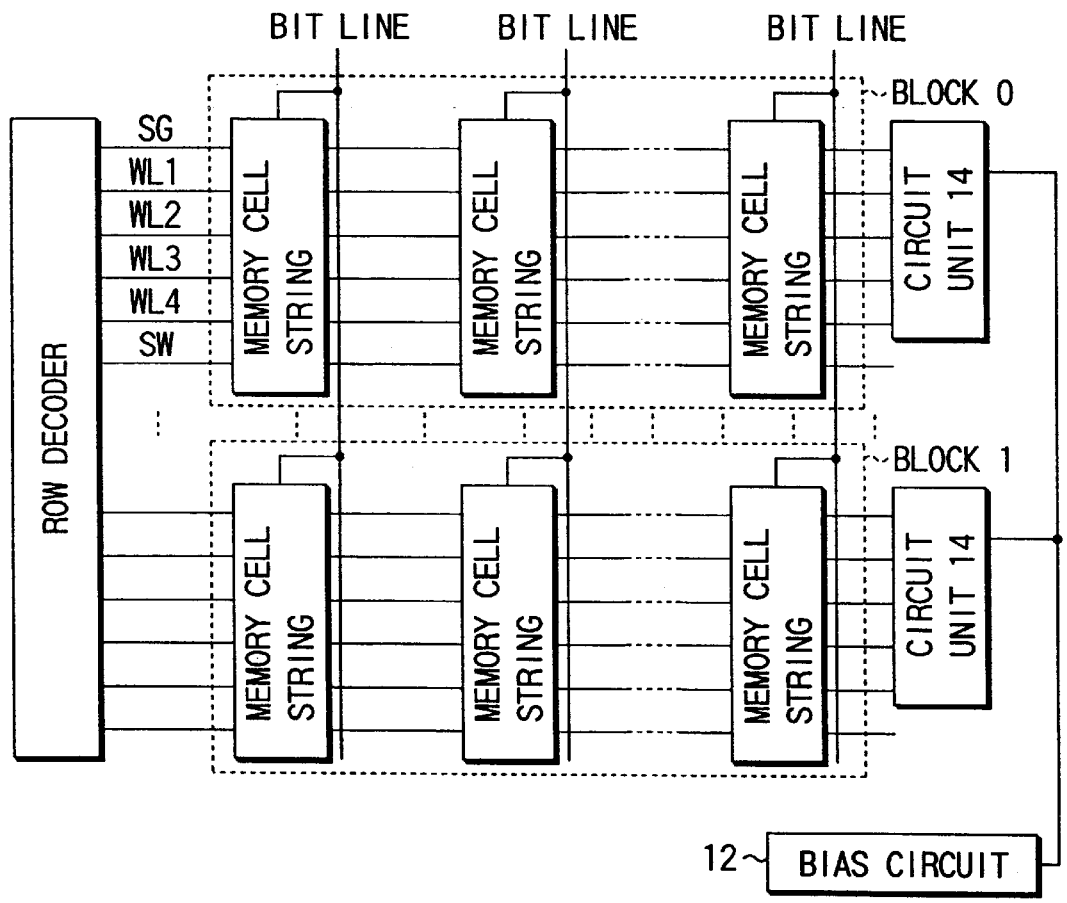
FIG. 6 is a block diagram showing a nonvolatile semiconductor memory according to a modification of the first embodiment of the present invention.

FIG. 6 is a block diagram showing a nonvolatile semiconductor memory according to a modification of the first embodiment of the present invention.

Figure 7:
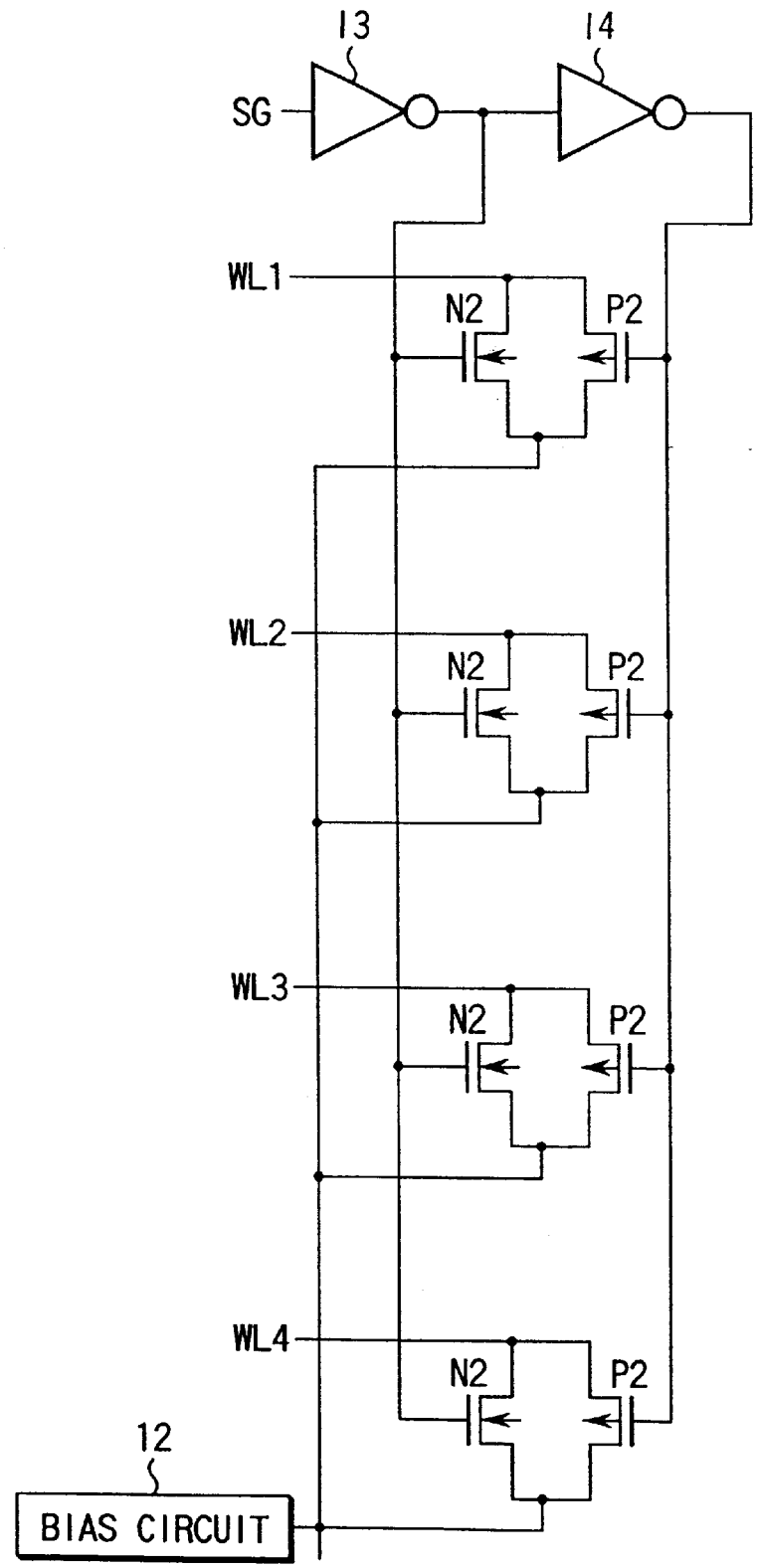
FIG. 7 is a circuit diagram showing the circuit unit of the nonvolatile semiconductor memory according to the modification of the first embodiment of the present invention.

In this modification, the transistors N2 and P2 shown in FIG. 4 are arranged as each circuit unit 14 on a side opposite to the row decoder with respect to the memory cell array. A circuit example of this circuit unit 14 is shown in FIG. 7.

In a memory cell string in which the signal SG is "1" and the selection transistor is selected, the output of an inverter I3 which receives the signal SG is "0", and the output of an inverter I4 which receives the output of the inverter I3 is "1". Hence, the N- and P-channel transistors N2 and P2 are turned off to supply a decode signal to each word line via the transistors N1 and P1 shown in FIG. 4.

If the signal SG is "0", and the selection transistor is unselected, the output of the inverter I3 is "1", and the output of an inverter I4 is "0". The transistors N2 and P2 are turned on to supply the output voltage OUTPUT from the bias circuit 12 to each word line via the transistors N2 and P2. At this time, the transistors N1 and P1 shown in FIG. 4 are turned off, and no decode signal is supplied to the bias circuit 12.

By arranging the transistors N1 and P1 and the transistors N2 and P2 on opposite sides of the memory cell array, the number of transistors arranged on one side can be decreased, and the circuit pattern can be laid out with a wider margin. Although the first embodiment uses the inverter I4, the signal SG may be directly supplied to the gate of the transistor P2 without using the inverter I4.

(Second Embodiment)

Figure 8:
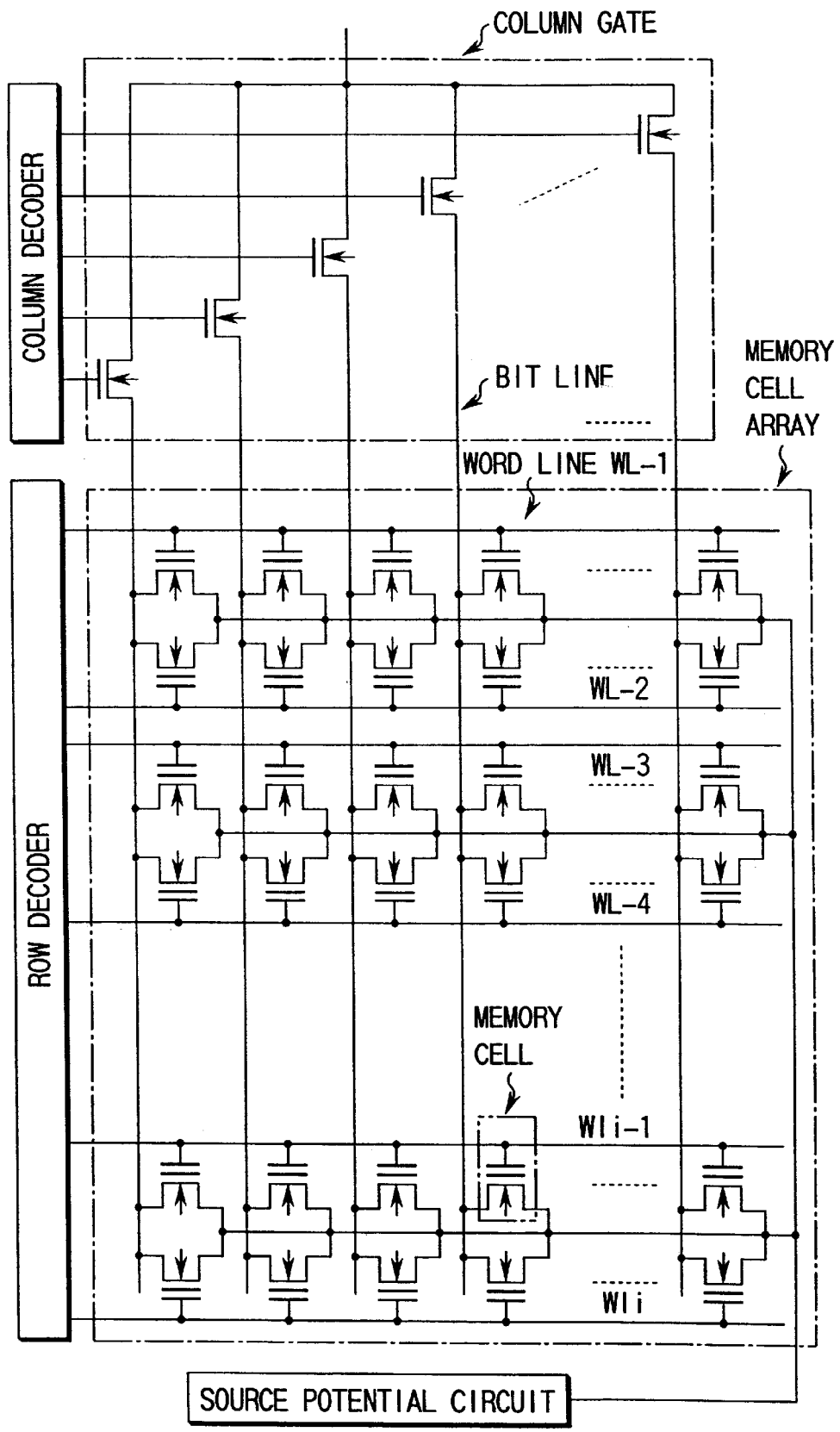
FIG. 8 is a circuit diagram showing the memory cell array of a NOR flash EEPROM.

FIG. 8 is a circuit diagram showing the memory cell array of a NOR flash EEPROM.

FIG. 8 shows the arrangement of a 1-bit output. For an 8-bit output, eight memory cell arrays are arranged on the same row. An example of arranging eight memory cell arrays is shown in FIG. 9.

As is well known, the NOR flash EEPROM erases data by setting the control gate to 0 V or a negative voltage, applying a high voltage to the source, and emitting electrons from the floating gate to the source of the cell transistor. In erase, a source potential circuit 21 applies a high voltage to the source. In data read and write, the source potential circuit 21 supplies the ground potential to the source of the cell transistor.

Figure 9:
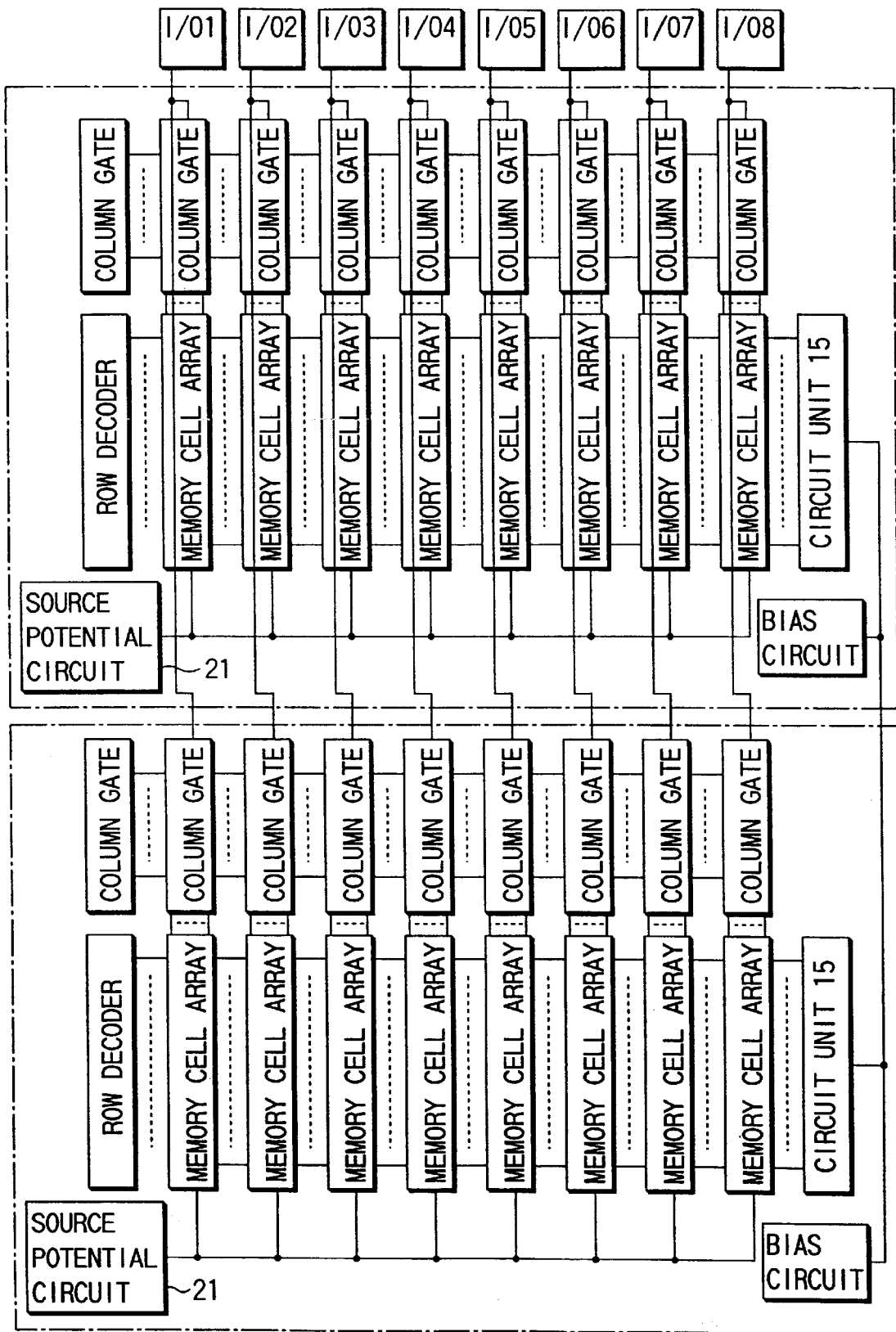
FIG. 9 is a block diagram showing the memory cell array and its vicinity of a nonvolatile semiconductor memory according to the second embodiment of the present invention.

In the second embodiment shown in FIG. 9, memory cell arrays are grouped into two blocks, as indicated by chain lines, and the source potential circuit 21 is arranged for each block to erase, write, and read out data in units of blocks.

In the second embodiment, a cell transistor in an unselected block stands by while the control gate is set to a predetermined voltage higher than the ground potential. This improves the reliability, particularly, the data holding reliability.

As shown in FIG. 9, each circuit unit 15 is arranged on a side opposite to a corresponding row decoder with respect to the memory cell array, and connected to the word lines of respective blocks.

Figure 10:
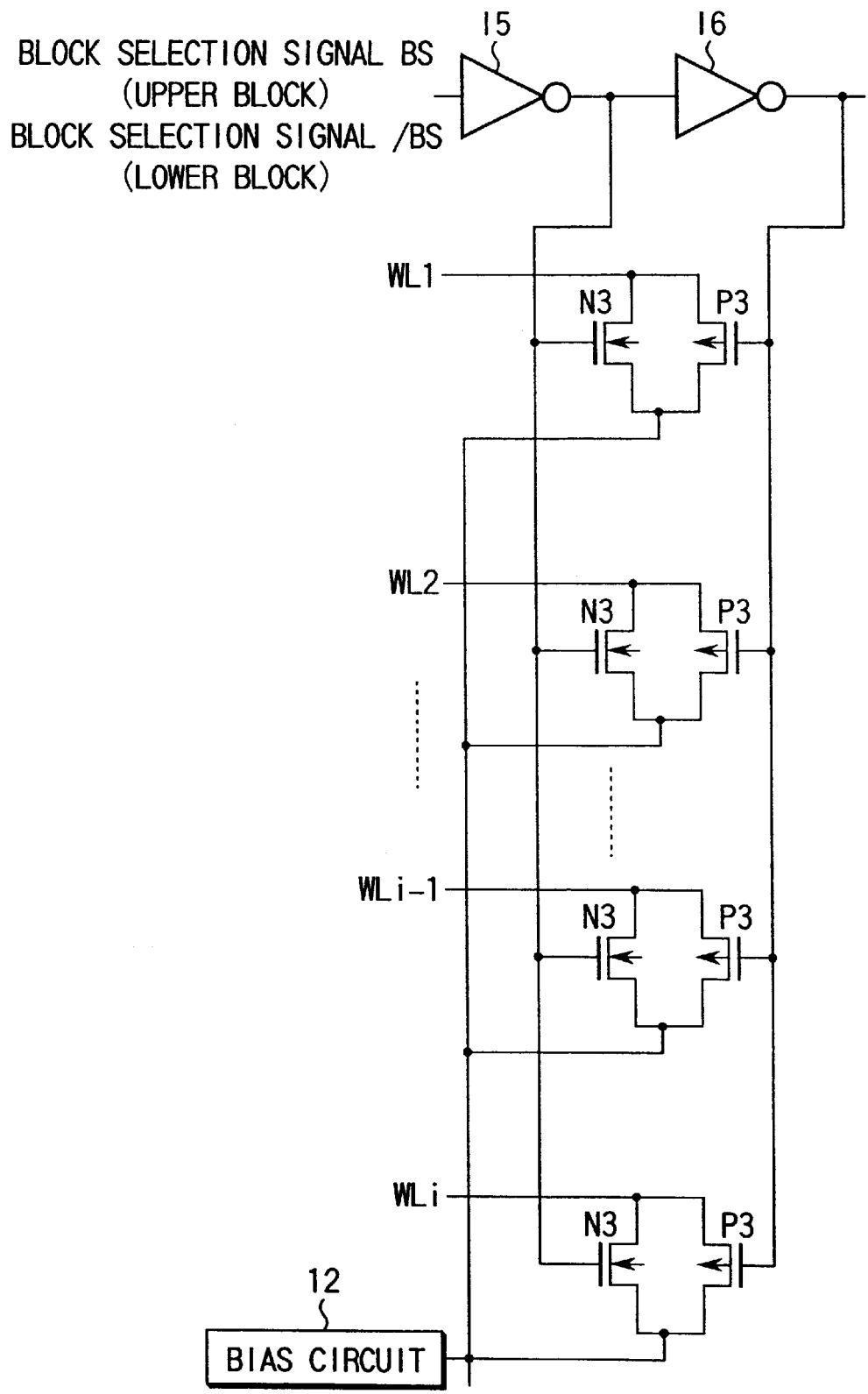
FIG. 10 is a circuit diagram showing the circuit unit of the nonvolatile semiconductor memory according to the second embodiment of the present invention.

A circuit example of the circuit unit 15 is shown in FIG. 10. In FIG. 10, a block selection signal BS determines which of upper and lower blocks in FIG. 9 is to be selected. For example, the signal BS of "1" selects the upper block, and the signal BS of "0" selects the lower block. In an unselected block, word lines are set to a predetermined potential, the outputs of all column decoders change to "0", and all the transistors of the column decoders are turned off. A signal corresponding to the upper block is the signal BS input to an inverter I5, and a signal corresponding to the lower block is an inverted signal /BS of the signal BS input to the inverter I5. In this case, the signal BS is input to the inverter I5.

When the signal BS is "1", and the upper block is selected, the output of the inverter I5 changes to "0", and each N-channel transistor N3 whose gate receives the output from the inverter I5 is turned off. The output of an inverter I6 which receives the output from the inverter I5 changes to "1", and each P-channel transistor P3 whose gate receives the output from the inverter I6 is also turned off. Since the transistors N3 and P3 are turned off, a bias circuit 12 connected to their one-side terminals is disconnected from each word line. Accordingly, the word line is controlled by an output from the row decoder.

When the signal BS is "0", and the upper block is in a standby state, the output of the inverter I5 changes to "1", and the N-channel transistor N3 whose gate receives the output from the inverter I5 is turned on. The output of the inverter I6 which receives the output from the inverter I5 changes to "0", and the P-channel transistor P3 whose gate receives the output from the inverter I6 is also turned on. Since the transistors N3 and P3 are turned on, the bias circuit 12 connected to their one-side terminals is connected to each word line via corresponding transistors N3 and P3. Then, the word line receives the output voltage OUTPUT from the bias circuit 12, and is set to a predetermined voltage. Compared to the prior art in which the word line is set to the ground potential, the reliability, particularly, the data holding reliability can be improved.

Figure 11:
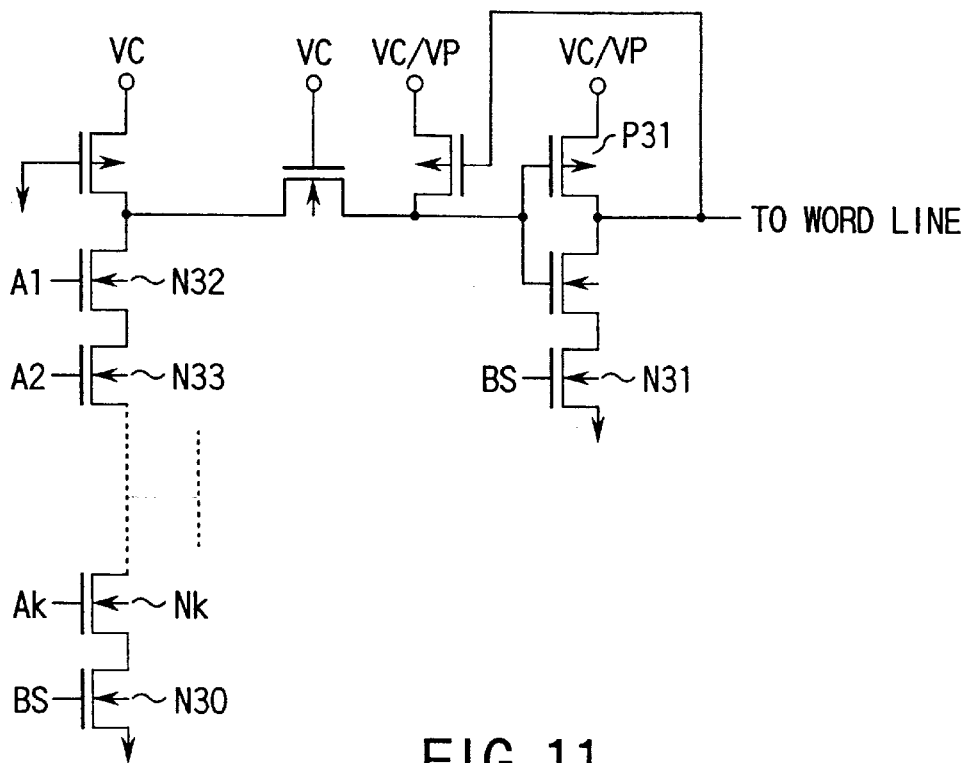
FIG. 11 is a circuit diagram showing a circuit example of the row decoder.

A circuit example of the row decoder is shown in FIG. 11. Since the signal BS is "1" in selecting a block containing the decoder, N-channel transistors N30 and N31 are turned on. N-channel transistors N32, N33, ..., Nk operate in response to address signals A1, A2, ..., Ak supplied to their gates, thereby controlling selection/non-selection of the word line. When the signal BS is "0", e.g., the block containing the decoder shown in FIG. 11 is unselected, the transistors N30 and N31 are turned off. The gate of a P-channel transistor P31 is charged to level "1" to turn off the transistor P31. Since the transistors N31 and P31 are turned off, the word line is not influenced by the decoder, and is controlled by only an output from the bias circuit 12.

Figure 12:
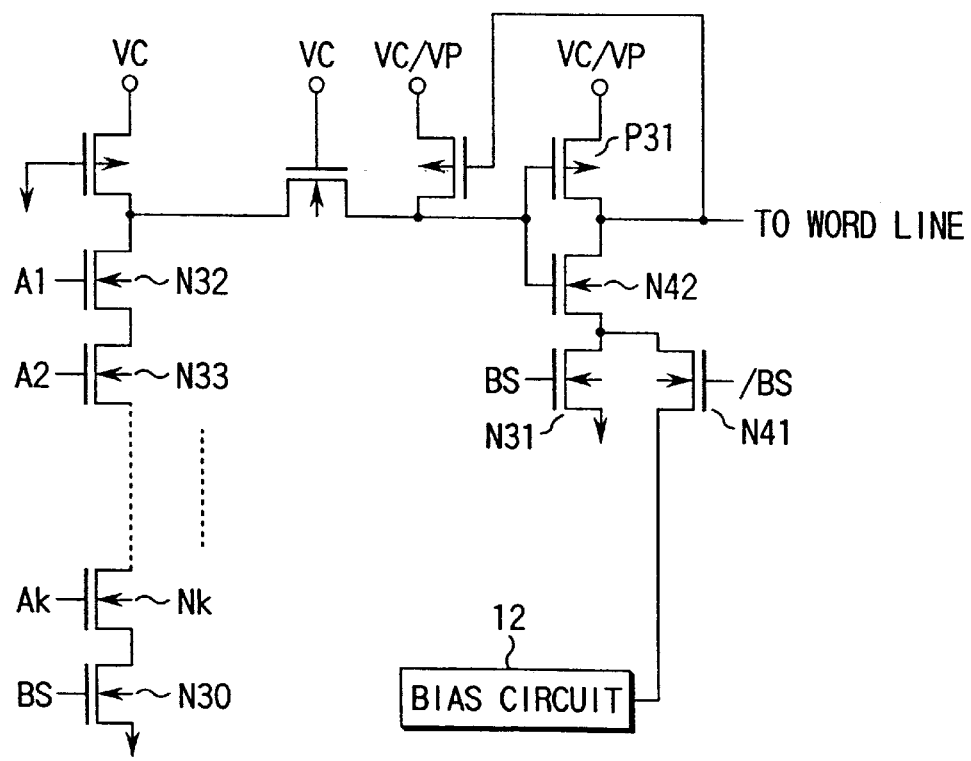
FIG. 12 is a circuit diagram showing another circuit example of the row decoder.

Another circuit example of the row decoder is shown in FIG. 12. This circuit example does not use any circuit unit shown in FIG. 10. The circuit example shown in FIG. 12 is different from the circuit example shown in FIG. 11 in that the drain of an N-channel transistor N41 is connected to that of the transistor N31. The source of the transistor N41 is connected to the bias circuit 12, and its gate receives the inverted signal /BS of the signal BS. For the signal BS of "1", the signal /BS is "0", the transistor N41 is turned off, and the circuit example shown in FIG. 12 operates similarly to that shown in FIG. 11. When the signal BS is "0", e.g., a block containing the decoder shown in FIG. 12 is unselected, the transistors N31 and P31 are turned off, similar to the circuit example shown in FIG. 11. In this case, the signal /BS is "1", and the gate of a transistor N42 is also "1". Thus, the bias circuit 12 is connected to a word line via the ON transistors N41 and N42, and each word line of the unselected block is set to a predetermined voltage.

Figure 13:
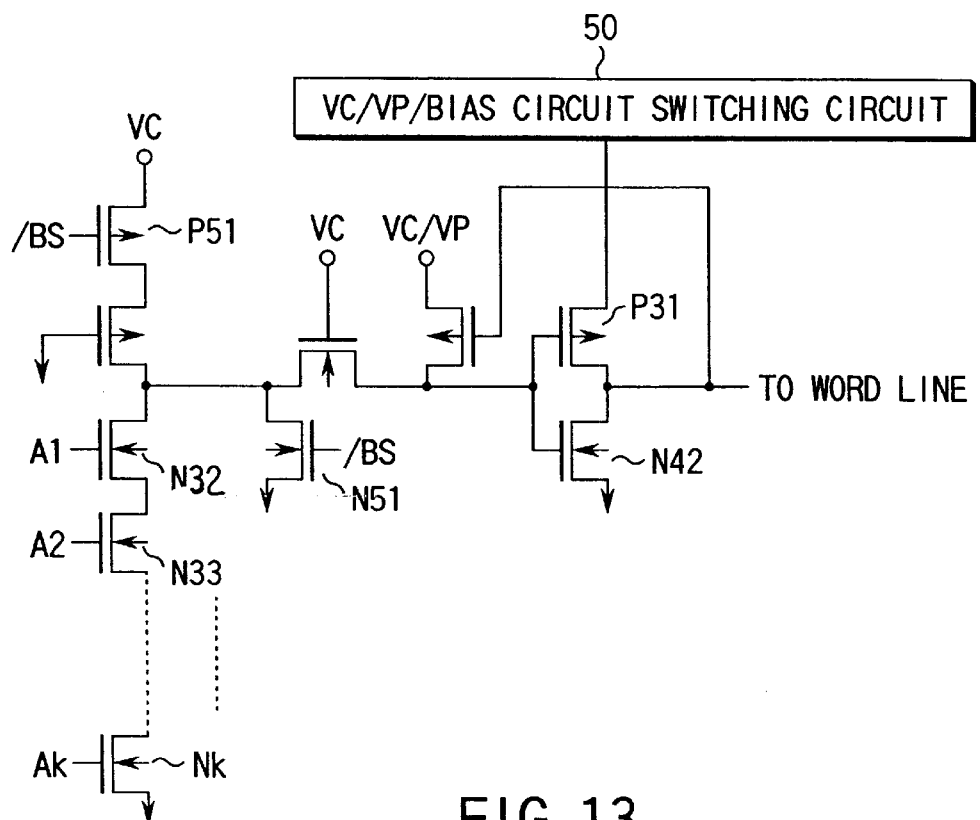
FIG. 13 is a circuit diagram showing still another circuit example of the row decoder.

FIG. 13 shows still another circuit example of the row decoder. IN the circuit example shown in FIG. 11, a power source voltage is applied to the transistor P31 by switching between the power supply voltage VC in data read and a high voltage VP in data write. To the contrary, in the circuit example shown in FIG. 13, a power source voltage is applied to the transistor P31 by switching between VC in data read, VP in data write, and a predetermined voltage from the bias circuit 12 in a standby state. This switching operation is done by, e.g., a VC/VP/bias circuit switching circuit 50. When a block containing the decoder shown in FIG. 13 is selected to read out and write data, the signal /BS changes to "0", a P-channel transistor P51 is turned on, and an N-channel transistor N51 is turned off. If a corresponding word line is selected in response to an address signal, VC or VP is output to the word line; and if a corresponding word line is unselected, the reference potential (ground potential) is output. When the block containing the decoder shown in FIG. 13 is unselected, the signal /BS changes to "1", the P-channel transistor P51 is turned off, and the N-channel transistor N51 is turned on. Then, the gates of the transistors P31 and N42 are set to the reference potential, the transistor P31 is turned on, and the transistor N42 is turned off. A voltage from the bias circuit 12 is output to the word line via the transistor P31, and the control gate of the cell transistor is set to a predetermined potential.

(Third Embodiment)

Figure 14:
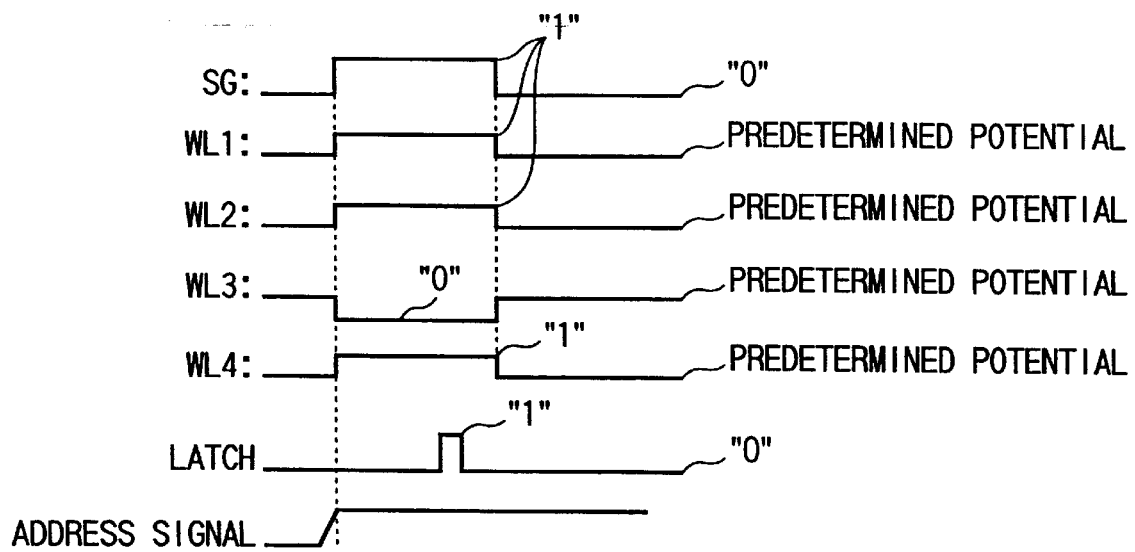
FIG. 14 is an operation waveform chart showing the operation of a nonvolatile semiconductor memory according to the third embodiment of the present invention.

FIG. 14 is an operation waveform chart showing the operation of a nonvolatile semiconductor memory according to the third embodiment of the present invention.

In the third embodiment, if data is read out from a selected block, the readout data is latched by a latch circuit, and the latched data is output. After the data is latched, a voltage from a bias circuit 12 is applied to all word lines, thereby relaxing the electric field between a charge accumulation layer and a substrate (channel). As a result, the data holding reliability of a cell transistor is improved. This equally applies to the NAND and the NOR flash EEPROMs. FIG. 14 typically shows the operation waveform of the NAND flash EEPROM in read.

As shown in FIG. 14, if a signal SG for selecting a selection transistor is "0", the control gates (WL1 to WL4) of cell transistors connected to the selection transistor receive a predetermined potential.

To the contrary, if the signal SG for selecting a selection transistor is "1", the control gate of a cell transistor connected to a selected word line WL3 among cell transistors connected to the selection transistor is set to "0", and the control gates of cell transistors connected to remaining word lines WL1, WL2, and WL4 are set to "1". Consequently, data stored in the cell transistor connected to the selected word line WL3 is read out to a sense amplifier and the like via the bit line. After the data is read out to the sense amplifier and the like, the latch signal (latch) changes to "1", the readout data is latched by the latch circuit, and the latched data is output from the latch circuit. Thereafter, the signal SG changes to "0", and the word lines WL1 to WL4 are set to a predetermined voltage, e.g., a potential capable of relaxing the electric field between the charge accumulation layer and the substrate (channel). Meanwhile, the data read out from the cell transistor is kept output from the latch circuit. For example, even if an externally supplied address signal does not change, the word line can be set to a predetermined potential after a predetermined time. The electric field between the charge accumulation layer and the substrate (channel) can be relaxed, compared to the prior art. Hence, the reliability of the cell transistor, particularly, the data holding reliability can be improved.

Also in the NOR flash EEPROM, for example, the block selection signal BS is maintained at "1" for a predetermined time to select a block, and readout data is latched. This can prolong the time during which the word line of a selected block is kept at a predetermined potential, so that the reliability, particularly, the data holding reliability can be improved.

Several embodiments of the present invention have been described above. However, the present invention is not limited to these embodiments, and can be variously changed within the spirit and scope of the present invention.

For example, in the above embodiments, four threshold voltages Vth1, Vth2, Vth3, and Vth4 are set to store data in one cell transistor. However, the number of threshold voltages set to store data in one cell transistor is not limited to four.

In the above embodiments, the lowest threshold voltage Vth1 among a plurality of threshold voltages is set to −2 V (or 1 V), the remaining voltages are sequentially set in the positive direction, and the highest threshold voltage Vth4 is set to 7 V (or 10 V). In this case, the potential $V_{CG}$ supplied to the control gate of an unselected cell transistor is 0.83 V (or 3.83 V), i.e., a positive value with respect to the reference potential (e.g., ground potential). However, the potential $V_{CG}$ is not limited to a positive value. For example, the polarity of the threshold voltage may be reversed, the threshold voltage Vth1 may be set to the highest voltage of, e.g., 2 V (or −1 V), the remaining voltages may be sequentially set in a negative direction, and the threshold voltage Vth4 may be set to the lowest voltage of −7 V (or −10 V). In this case, the potential $V_{CG}$ supplied to the control gate of an unselected cell transistor takes a negative value. That is, the potential $V_{CG}$ is not limited to a negative or positive potential, and suffices to be a potential between the maximum and minimum threshold voltages set for the cell transistor in the memory cell array.

The potential $V_{CG}$ of an unselected cell transistor may be the average of N threshold voltages (N is a positive integer of 3 or more). For example, the potential $V_{CG}$ may be between the threshold voltages Vth1 and Vth3 or between the threshold voltages Vth2 and Vth4.

When the selection transistor is unselected in read or write in a memory having a memory cell string containing the selection transistor, e.g., in a NAND flash EEPROM, a potential different from the ground potential may be supplied to the gate of a cell transistor in the memory cell string connected to the unselected selection transistor.

When the memory cell array is unselected in read or write in, e.g., a NOR flash EEPROM, a potential different from the ground potential may be supplied to the gate of a cell transistor in the unselected memory cell string.

Figure 15A:
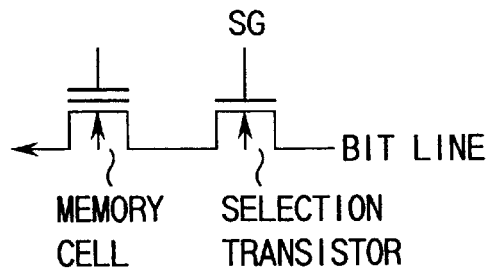
FIGS. 15A, 15B, 15C, and 15D are equivalent circuit diagrams each showing another example of the memory cell.
Figure 15B:
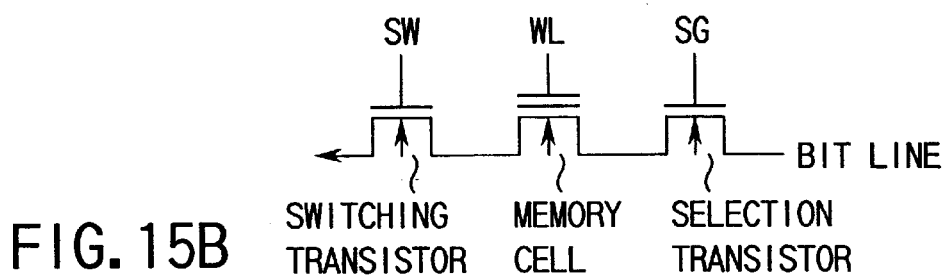
Figure 15C:
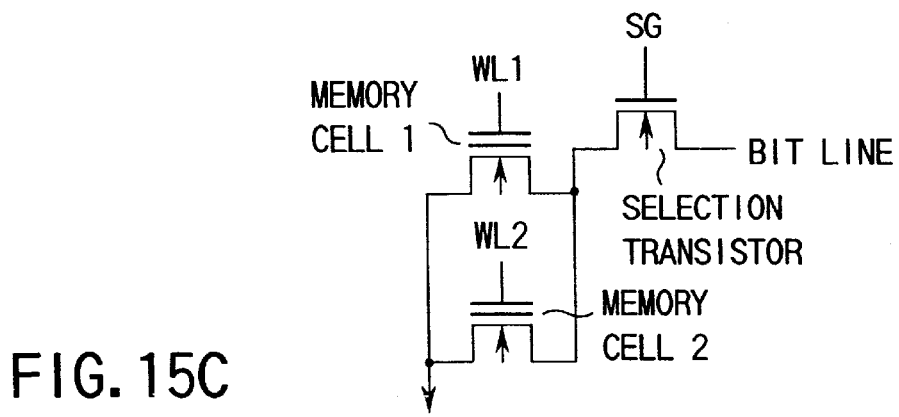
Figure 15D:
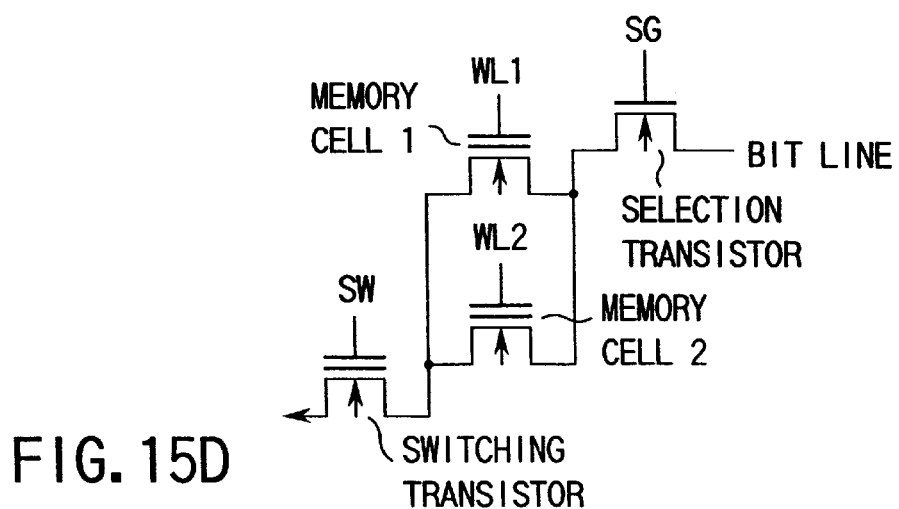

The arrangement of the cell transistor or memory cell transistor is also not limited to the above embodiments. As several examples of the memory cell strings, a selection transistor and one cell transistor may be series-connected, as shown in FIG. 15A, a selection transistor, one cell transistor, and a switching transistor may be series-connected, as shown in FIG. 15B, a selection transistor and a plurality of parallel-connected cell transistors may be series-connected, as shown in FIG. 15C, or a selection transistor, a plurality of parallel-connected cell transistors, and a switching transistor may be series-connected, as shown in FIG. 15D.

The present invention can be variously modified.

As has been described above, the present invention can provide a nonvolatile semiconductor memory capable of suppressing a decrease in data holding reliability even when one cell transistor stores data of a plurality of bits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which cell transistors each having a charge accumulation layer are arranged in a matrix; and
   a potential supply circuit configured, at least in a read operation, to supply a potential different from a ground potential to gate of the cell transistors when the memory cell array is unselected.

2. The device according to claim 1, further comprising:
   a latch circuit configured to latch data read out from the cell transistor,
   wherein after data read out from the cell transistor is latched by the latch circuit, the selection transistor coupled to the cell transistor from which the data is read out is unselected, and the potential different from the ground potential is supplied to the gate of the unselected cell transistor.

3. The device according to claim 1, when the semiconductor memory is in a standby state, the potential different from the ground potential is supplied to the gate of the cell transistor.

4. The device according to claim 1, wherein the potential different from the ground potential is a potential between maximum and minimum threshold voltages set for the cell transistor.

5. The device according to claim 1, wherein the cell transistor stores bits of data as the threshold voltage of the cell transistor is changed.

6. The device according to claim 1, wherein the potential different from the ground potential is positive potential higher than the ground potential.

7. The device according to claim 6, wherein the cell transistor stores bits of data as a threshold voltage of the cell transistor is changed.

8. The device according to claim 7, further comprising:

a switch circuit configured to transfer the potential different from the ground potential, the switch circuit coupled between the cell transistor and the potential supply circuit.

9. The device according to claim 1, further comprising:

a plurality of memory cell arrays, each of the memory cell arrays including cell transistors arranged in a matrix, each of the cell transistors having a charge accumulation layer; and a decoding circuit for selecting at least one of the memory cell arrays and at least one of the cell transistors of the selected memory cell array.

10. The device according to claim 9, wherein the potential different from the ground potential is a positive potential higher than the ground potential.

11. The device according to claim 10, wherein the cell transistor stores bits of data as a threshold voltage of the cell transistor is changed.

12. A semiconductor memory device, comprising:

a first block including a plurality of memory cell arrays, each of the plurality of memory cell arrays including cell transistors each having a charge accumulation layer and word lines coupled to gates of the cell transistors;

a second block including a plurality of memory cell arrays, each of the plurality of memory cell arrays including cell transistors each having a charge accumulation layer and word lines coupled to gates of the cell transistors;

a first circuit unit configured, at least in a read operation, to supply a potential different from a ground potential to the word lines of the first block when the first block is unselected; and a second circuit unit configured, at least in a read operation, to supply a potential different from a ground potential to the word lines of the second block when the second block is unselected.

13. The device according to claim 12, wherein the first circuit unit includes a plurality of transistors connected to the word lines of the first block, the plurality of transistors of the first circuit unit are controlled by a first block selection signal, and second circuit unit includes a plurality of transistors connected to the word lines of the second block, the plurality of transistors of the second circuit unit are controlled by a second block selection signal.

14. The device according to claim 13, further comprising:

a bias circuit which generates the potential different from a ground potential, the bias circuit connected to the plurality of transistors of the first block and the plurality of transistors of the second block each connected to a bias circuit.

* * * * *